United States Patent
Srividya et al.

(10) Patent No.: US 7,537,804 B2
(45) Date of Patent: May 26, 2009

(54) ALD METHODS IN WHICH TWO OR MORE DIFFERENT PRECURSORS ARE UTILIZED WITH ONE OR MORE REACTANTS TO FORM MATERIALS OVER SUBSTRATES

(75) Inventors: Cancheepuram V. Srividya, Boise, ID (US); Noel Rocklein, Boise, ID (US); John Vernon, Boise, ID (US); Jeff Nelson, Boise, ID (US); F. Daniel Gealy, Boise, ID (US); David Korn, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 321 days.

(21) Appl. No.: 11/413,466

(22) Filed: Apr. 28, 2006

(65) Prior Publication Data
US 2007/0252244 A1 Nov. 1, 2007

(51) Int. Cl.
C23C 16/455 (2006.01)
(52) U.S. Cl. .............................. 427/255.31; 427/255.32
(58) Field of Classification Search ............ 427/255.31, 427/255.32; 117/88, 89
See application file for complete search history.

(56) References Cited

U.S. PATENT DOCUMENTS

| | | | |
|---|---|---|---|
| 6,007,875 A | 12/1999 | Grunwald et al. | |
| 6,200,893 B1 * | 3/2001 | Sneh | 438/685 |
| 6,203,613 B1 * | 3/2001 | Gates et al. | 117/104 |
| 6,355,561 B1 | 3/2002 | Sandhu et al. | |
| 6,511,539 B1 * | 1/2003 | Raaijmakers | 117/102 |
| 6,551,929 B1 * | 4/2003 | Kori et al. | 438/685 |
| 6,630,201 B2 * | 10/2003 | Chiang et al. | 427/255.28 |
| 6,730,164 B2 * | 5/2004 | Vaartstra et al. | 117/104 |
| 6,809,370 B1 | 10/2004 | Colombo et al. | |
| 6,833,161 B2 * | 12/2004 | Wang et al. | 427/250 |
| 6,930,059 B2 * | 8/2005 | Conley et al. | 438/785 |
| 6,936,901 B2 | 8/2005 | Yamamoto | |
| 6,958,302 B2 * | 10/2005 | Ahn et al. | 438/785 |
| 7,151,039 B2 | 12/2006 | Lee et al. | |
| 7,332,442 B2 * | 2/2008 | Vaartstra et al. | 438/758 |
| 2004/0238872 A1 | 12/2004 | Lee et al. | |
| 2005/0023584 A1 * | 2/2005 | Derderian et al. | 257/296 |
| 2005/0227003 A1 * | 10/2005 | Carlson et al. | 427/248.1 |
| 2006/0249077 A1 * | 11/2006 | Kim et al. | 118/723 MP |
| 2008/0020593 A1 * | 1/2008 | Wang et al. | 438/782 |

FOREIGN PATENT DOCUMENTS

WO WO 2004/108985 * 12/2004

OTHER PUBLICATIONS

Rittersma, Z.M., et al., "HfSiO4 Dielectric Layers Deposited by ALD Using HfCl4 and NH2(Ch2)3Si(OC2H5)3 Precursors". Journal of the Electrochemical Society, 2004. no page numbers. Abstract Only.*

* cited by examiner

Primary Examiner—Bret Chen
(74) Attorney, Agent, or Firm—Wells St. John, P.S.

(57) ABSTRACT

In some embodiments, the invention may include utilization of at least one iteration of an ALD pulse sequence that has the pulse subsets $M_2$-$M_1$-R- and $M_1$-$(R-M_2-)_x$: where x is at least 2; where $M_1$ is a first metal-containing precursor comprising a first metal, $M_2$ is a second metal-containing precursor comprising a second metal different from the first metal, and R is a reactant which reacts with one or both of the first and second metals. The ALD pulse sequence forms material over a substrate, and such material includes the first and second metals. The hyphen between pulses means that the second pulse directly follows the first pulse, with the term "directly follows" indicating that the second pulse either immediately follows the first pulse or that only a purge separates the first and second pulses.

23 Claims, 8 Drawing Sheets

ALD METHODS IN WHICH TWO OR MORE DIFFERENT PRECURSORS ARE UTILIZED WITH ONE OR MORE REACTANTS TO FORM MATERIALS OVER SUBSTRATES

TECHNICAL FIELD

The invention pertains to methods of forming material over substrates, and in particular aspects pertains to methods of forming material over semiconductor substrates.

BACKGROUND OF THE INVENTION

Various technologies have been developed for applying thin films over substrates, and particularly for applying thin films during fabrication of semiconductor devices. Such technologies include chemical vapor deposition (CVD) and atomic layer deposition (ALD). ALD and CVD are similar to one another in that both comprise utilization of volatile precursor materials to form a desired deposit over a substrate. CVD and ALD differ from one another, however, in that CVD typically includes reaction of precursors in vapor phase over a substrate to form a desired deposit, whereas ALD typically comprises chemisorption of a precursor component onto a substrate followed by reaction with the chemisorbed component to form a desired deposit.

Specific attributes of typical ALD technology and typical CVD technology are described below. First, however, it is useful to provide definitions of particular terms utilized throughout this document. The deposition methods referred to herein can be described in the context of formation of materials on one or more semiconductor substrates. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of the present document, "metal" or "metal element" refers to the elements of Groups IA, IIA, and IB to VIIIB of the periodic table of the elements (i.e., groups 1-12 of the new IUPAC system) along with the portions of Groups IIIA to VIA (groups 13 and 14 of the new IUPAC system) designated as metals in the periodic table, namely, Al, Ga, In, Tl, Ge, Sn, Pb, Sb, Bi, and Po. The lanthanides and actinides are included as part of Group IIIB; and the "lanthanides" and "actinides" are to be understood to include lanthanum and actinium, respectively. "Non-metals" refers to the remaining elements of the periodic table.

Next, referring to attributes of ALD technology, such can, but does not always, involve formation of successive atomic layers on a substrate. The layers may comprise, for example, an epitaxial, polycrystalline, and/or amorphous material. ALD may also be referred to as atomic layer epitaxy, atomic layer processing, etc.

Described in summary, ALD includes exposing an initial substrate to a first chemical species to accomplish chemisorption of the species onto the substrate. Theoretically, the chemisorption forms a monolayer that is uniformly one atom or molecule thick on the entire exposed initial substrate. In other words, a saturated monolayer. Practically, as further described below, chemisorption might not occur on all portions of the substrate. Nevertheless, such an imperfect monolayer is still a monolayer in the context of this document. In many applications, merely a substantially saturated monolayer may be suitable. A substantially saturated monolayer is one that will still yield a deposited layer exhibiting the quality and/or properties desired for such layer.

The first species is purged from over the substrate and a second chemical species is provided to chemisorb onto the first monolayer of the first species. The second species is then purged and the steps of utilizing the first and second species can be repeated with exposure of the second species monolayer to the first species. In some cases, the two monolayers may be of the same species. Also, a third species or more may be successively chemisorbed and purged just as described for the first and second species. It is noted that one or more of the first, second and third species can be mixed with inert gas to speed up pressure saturation within a reaction chamber.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, Ne, Kr, Xe, etc. Purging may instead include contacting the substrate and/or monolayer with any gaseous substance that allows chemisorption byproducts to desorb and reduces the concentration of a species preparatory to introducing another species. A suitable amount of purging can be determined experimentally as known to those skilled in the art. Purging time may be successively reduced to a purge time that yields an increase in film growth rate. The increase in film growth rate might be an indication of a change to a non-ALD process regime and may be used to establish a purge time limit.

ALD is often described as a self-limiting process, in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick. The various aspects of the present invention described herein are applicable to any circumstance where ALD may be desired. It is further noted that local chemical interactions can occur during ALD (for instance, an incoming reactant molecule can displace a molecule from an existing surface rather than forming a monolayer over the surface).

Traditional ALD can occur within frequently-used ranges of temperature and pressure, and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art.

Referring next to CVD technology, such includes a variety of more specific processes, including, but not limited to, plasma enhanced CVD and others. CVD is commonly used to form non-selectively a complete, deposited material on a substrate. One characteristic of CVD is the simultaneous presence of multiple species in the deposition chamber that react to form the deposited material. Such condition is contrasted with the purging criteria for traditional ALD wherein a substrate is contacted with a single deposition species that chemisorbs to a substrate or previously deposited species. In addition, an ALD process regime may provide a simultaneously contacted plurality of species of a type or under conditions such that ALD chemisorption, rather than CVD reaction occurs. Instead of reacting together, the species may chemisorb to a substrate or previously deposited species, providing a surface onto which subsequent species may next chemisorb to form a complete layer of desired material.

Under most CVD conditions, deposition occurs largely independent of the composition or surface properties of an underlying substrate. By contrast, chemisorption rate in ALD might be influenced by the composition, crystalline structure, and other properties of a substrate or chemisorbed species.

Among the advantages of ALD-type technologies (with the term "ALD-type" referring to technologies that are either true ALD processes or that are more similar to ALD processes than to other deposition processes), is that such can theoretically be self-limiting processes. Specifically, a substrate exposed to appropriate precursor will only have a monolayer chemisorbed thereover, regardless of the length of time of the exposure or the quantity of precursor utilized in the exposure. In other words, the substrate can be exposed to an excess of precursor, and yet only a monolayer will be formed.

As another aspect of the prior art, it is desired to fabricate various dielectric materials to have a high dielectric constant (in other words, a high k value). Such high-k dielectric materials can be utilized in, for example, capacitors as capacitor dielectrics. Among the compositions suitable for incorporation into high-k dielectric materials is hafnium oxide. The hafnium oxide can exist in numerous forms, including an amorphous form, and monoclinic, tetragonal, cubic and orthorhombic crystalline forms. The preferred form of hafnium oxide for high-k dielectric materials is the tetragonal crystalline form, as such has the highest dielectric constant of the various forms of hafnium oxide. It is thus desirable to develop methodologies for controllably forming hafnium oxide having tetragonal crystalline structure throughout.

Zirconium oxide has similar properties to hafnium oxide, and it would be desirable if the methodologies developed for formation of hafnium oxide could also be utilized for deposition of zirconium oxide.

It could also be desirable to for new methodologies to be applicable for deposition of other materials, in addition to, or alternatively to, hafnium oxide and zirconium oxide.

SUMMARY OF THE INVENTION

In one aspect, the invention includes a method of forming a material over a substrate. At least one iteration an ALD-type pulse sequence is utilized, with the pulse sequence including the pulse subsets $M_2$-$M_1$-R and $M_1$-($R$-$M_2$-)$_x$. In such pulse subsets, x is at least 2, the hyphen between pulses means that one pulse follows another either immediately or with only purging separating the pulses, $M_1$ is a first metal-containing precursor comprising a first metal, $M_2$ is a second metal-containing precursor comprising a second metal different from the first metal, and R is a reactant which reacts with one or both of the first and second metals. The material formed over the substrate with the pulse sequence comprises the first and second metals, and at least a portion of the material is product from reaction of the reactant with one or both of the first and second metals. In particular aspects, the first and second metals can be aluminum and hafnium, respectively, and the reactant can correspond to ozone.

In one aspect, the invention includes another method of forming a material over a substrate. At least one iteration an ALD-type pulse sequence is utilized, with the pulse sequence including the pulse subsets R-$M_1$-, R-$M_2$- and $M_2$-$M_1$-R. In such pulse subsets, the hyphen between pulses means that one pulse follows another either immediately or with only purging separating the pulses, $M_1$ is a first metal-containing precursor comprising a first metal, $M_2$ is a second metal-containing precursor comprising a second metal different from the first metal, and R is a reactant which reacts with one or both of the first and second metals. The material formed over the substrate includes the first and second metals, and at least a portion of the material is product from reaction of the reactant with one or both of the first and second metals.

In one aspect, the invention includes another method of forming a material over a substrate. The substrate is placed within a reaction chamber and subjected to the following processing. A pulse sequence of reactant directly followed by first precursor is provided in the chamber. The first precursor is in the chamber at a different and substantially non-overlapping time than the reactant. A pulse sequence of the reactant directly followed by second precursor is provided in the chamber (with term "directly" meaning the second precursor either immediately follows the reactant into the chamber, or that the pulse of second precursor is separated from the pulse of reactant only by purging). The second precursor is in the chamber at a different and substantially non-overlapping time than the reactant. The second precursor is different than the first precursor. Another pulse of the second precursor is provided within the reaction chamber. This pulse forms a substantially saturated monolayer containing a second component from the second precursor. Substantially all of the second precursor is removed from within the reaction chamber via appropriate purging, which can including pumping material from the chamber and/or flow of purge gas through the chamber. Another pulse of the first precursor is provided within the reaction chamber. This pulse provides a first component from the first precursor, which is integrated within the substantially saturated monolayer. Substantially all of the first precursor is removed from within the reaction chamber via appropriate purging, which can including pumping material from the chamber and/or flow of purge gas through the chamber. The substantially saturated monolayer is then exposed to the reactant. In some aspects, the reactant can be ozone, the second component can be hafnium, and the first component can be aluminum.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention includes methods for forming hafnium oxide having high permittivity (or in other words, a high dielectric constant). If hafnium oxide is deposited in substantially pure form, the material will crystallize at a temperature of about 450° C., and the crystallized material will have a permittivity of from about 22 to about 25. The permittivity is less than that of hafnium oxide in the tetragonal crystalline phase, and more than that of hafnium oxide in other crystalline phases, and reflects that the hafnium oxide contains a mixture of tetragonal crystalline phase with various other crystalline phases. In contrast, if aluminum oxide is mixed with the hafnium oxide in appropriate proportion, the resulting mixed material will remain amorphous to processing temperatures of from about 600° C. to about 700° C.; and, once the mixed material crystallizes, it will crystallize with the hafnium oxide being primarily in the tetragonal crystalline form. In general, the higher the concentration of aluminum, the more resistant to crystallization the mixed material will be, and the higher the proportion of tetragonal crystalline phase that ultimately forms. However, since aluminum oxide has a lower permittivity than hafnium oxide, the more aluminum oxide that is present, the lower the permittivity of the mixed material, regardless of the crystalline form of the hafnium oxide. Typically, dielectric materials containing mixtures of hafnium oxide and aluminum oxide will have permittivity of from about 15 to about 19.

Aluminum oxide can be alloyed into dielectric films with hafnium oxide through ALD processing in which hafnium oxide deposition cycles alternate with aluminum oxide deposition cycles. The ratio of hafnium to aluminum within the dielectric materials can be adjusted by adjustment of the ALD cycle ratio.

Two methods of forming dielectric materials containing mixtures of aluminum oxide and hafnium oxide are the so-called alloy process, and the so-called metal/metal/oxidizer (MMO) process. The alloy process is described with reference to a flow chart diagram of FIG. 1, and the MMO process is described with reference to a flow chart diagram of FIG. 2. The labels "$M_1$" and "$M_2$" are used in FIGS. 1 and 2 to designate first and second metal precursors, respectively, and the label "R" is used to designate a reactant. One of the first and second precursors will contain aluminum (such as, for example, trimethyl aluminum (TMA)), and the other will contain hafnium (such as, for example, tetrakis-dimethylamino hafnium (TDMAH), tetrakis-diethylamido hafnium (TDEAH) or tetrakis-methylethylamido hafnium (TMEAH)). The reactant will be an oxidizing reactant, such as, for example, ozone ($O_3$). The alloy process and the MMO process can be utilized for formation of other materials besides mixed aluminum oxide/hafnium oxide dielectrics, and in such aspects $M_1$ and $M_2$ can generically refer to precursors, and typically refer to metal-containing precursors; and R can generically refer to any suitable reactant, including, for example, reactants containing oxygen, nitrogen or silicon utilized to form oxide, nitrides or silicides. In some aspects of the invention described herein, "R" can comprise, consist essentially of, or consist of one or more of $O_3$, $H_2O$, NO and $NH_3$.

Figure 1:
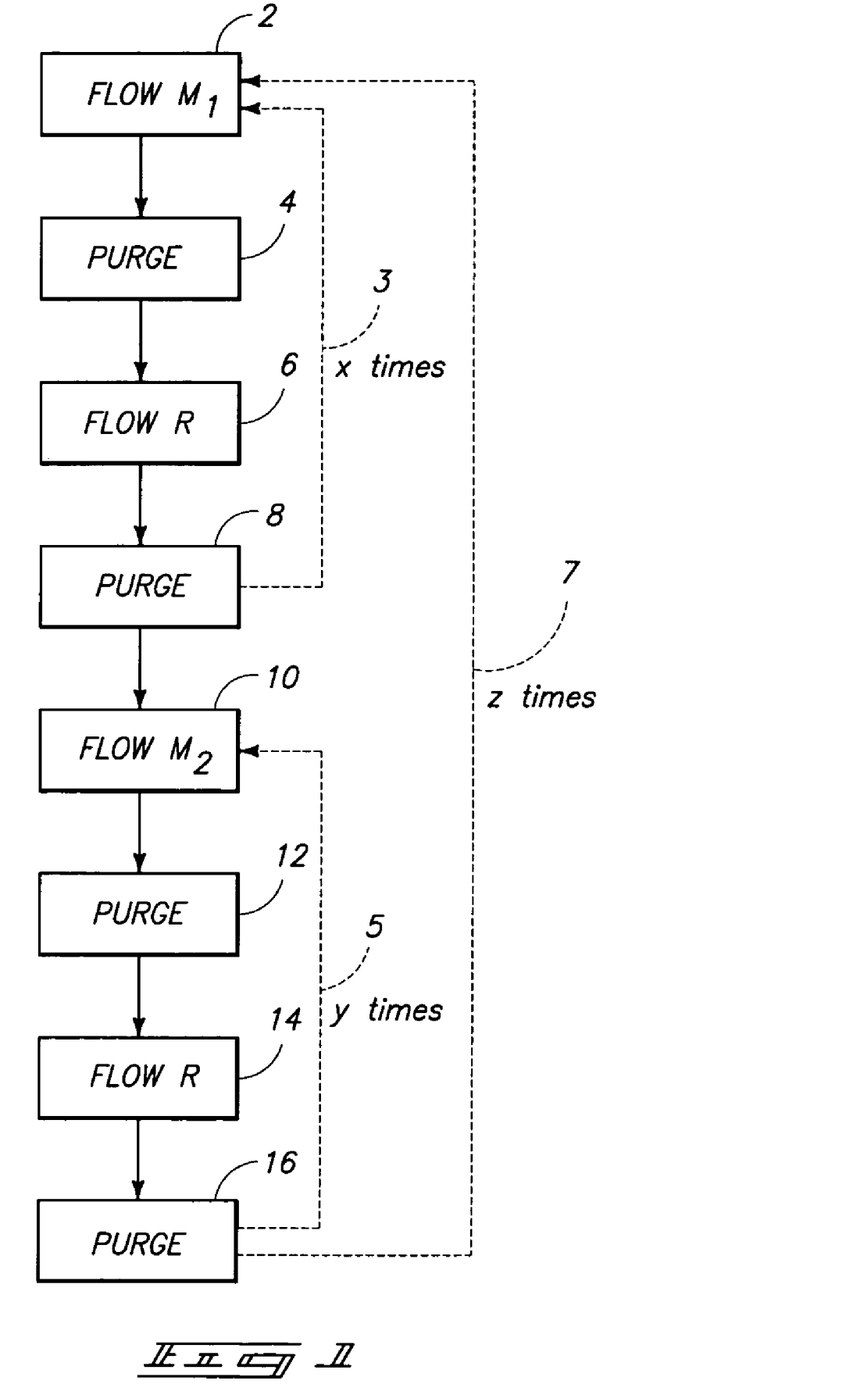
FIG. 1 is a flow-chart diagram describing an alloy process which can be incorporated into the present invention.
Figure 2:
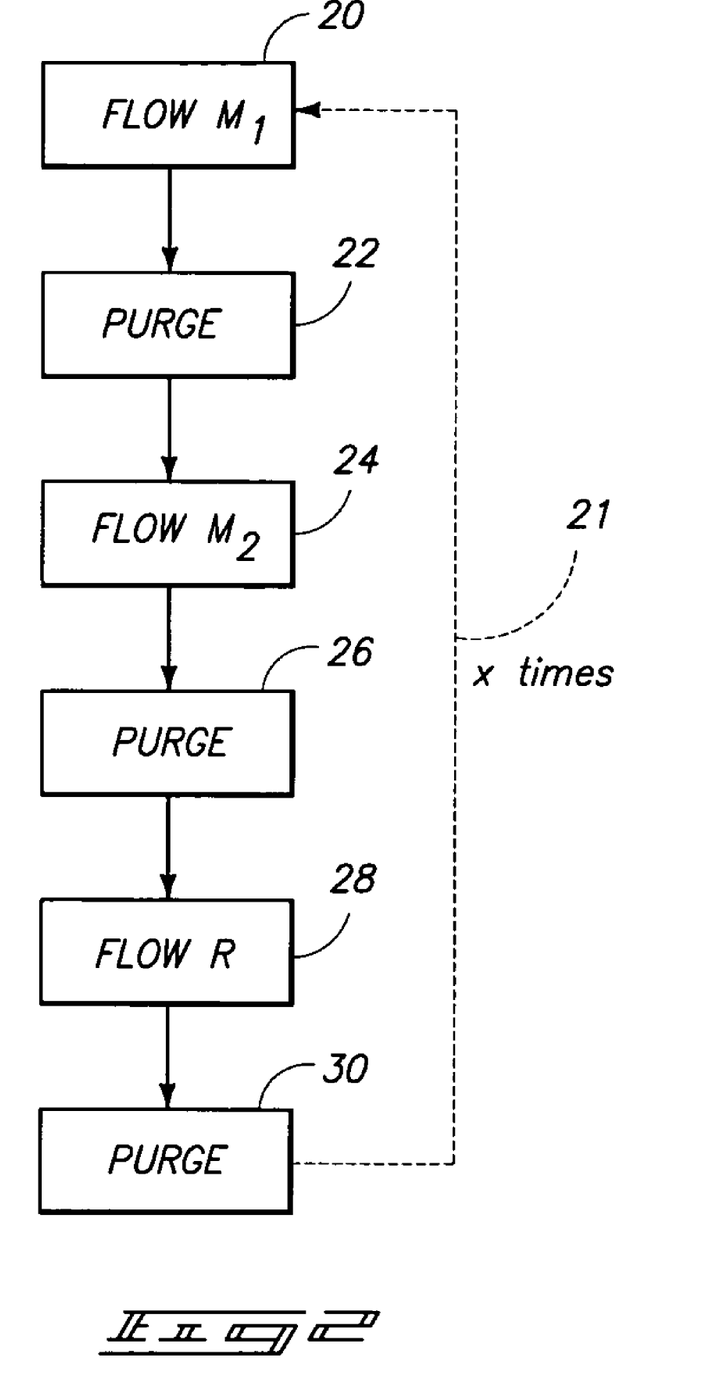
FIG. 2 is a flow-chart diagram describing a metal/metal/oxidizer (MMO) process which can be incorporated into the present invention.
Figure 14:
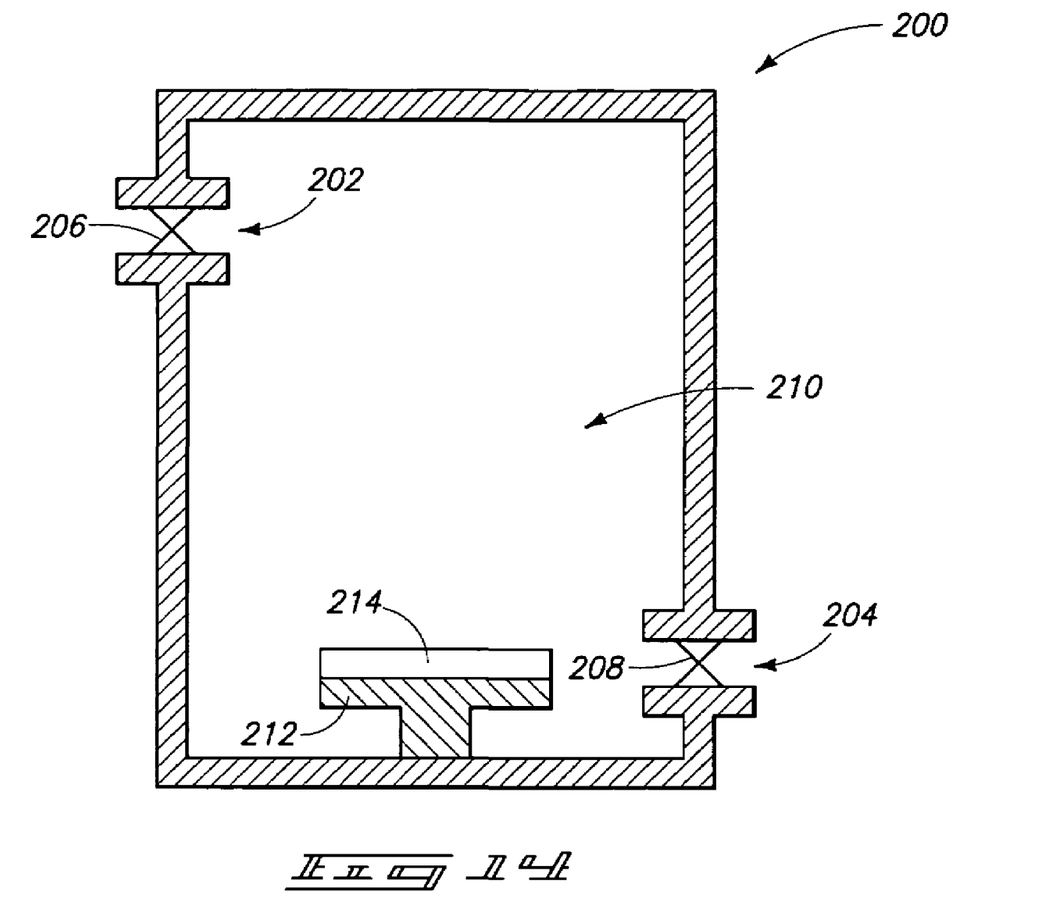
FIG. 14 is a diagrammatic, cross-sectional view of an exemplary reaction chamber which can be utilized in aspects of the present invention.

Both of the reaction sequences of FIGS. 1 and 2 are ALD-type processes. Before discussing the sequences in detail, an exemplary ALD apparatus is described with reference to FIG. 14. Specifically, FIG. 14 shows an exemplary apparatus 200 which can be utilized for ALD, or ALD-type processes. The apparatus 200 comprises a reaction chamber 210, and comprises an inlet 202 and an outlet 204 extending into the chamber. The inlet 202 has a valve 206 within it, and the outlet 204 has a valve 208 within it. The apparatus 200 also comprises a substrate holder 212 within the chamber, and a substrate 214 is shown supported by the holder 212.

In operation, materials are flowed into chamber 210 through inlet 202, and exhausted from the chamber through outlet 204. Apparatus 200 can be utilized for ALD-type procedures by providing precursors and reactants within the chamber at substantially non-overlapping times relative to one another. For instance, a first precursor can be flowed into the chamber through inlet 202 to a desired concentration within the chamber, and such concentration can be maintained within the chamber for a desired time. The first precursor can then be purged from the chamber through outlet 204. Such purging can be accomplished by flowing an inert purge gas through chamber 210 and additionally, or alternatively, utilizing vacuum to pull the first precursor out of chamber 210 through outlet 204. After the first precursor has been purged from within the chamber, a second precursor (or, in some aspects, a reactant), can be provided within the chamber to a desired concentration, and maintained at such concentration for a desired period of time. The second precursor, (or, in some aspects, the reactant), can then be purged from within the chamber.

The purge of a particular material from the chamber typically removes substantially all of the material from within the chamber. The term "substantially all" is utilized to indicate that the amount of material within the chamber is reduced to a level where gas-phase reactions with subsequent materials do not degrade properties of a deposited layer formed over the substrate 214. The term "purging substantially all" of a material includes aspects in which the vast majority of material is removed from within a reaction chamber as well as aspects in which an entirety of the material is removed from within the reaction chamber, with a material being considered entirely removed from a reaction chamber if there is no detectible amount of the material remaining within the reaction chamber.

Two materials are considered to be present in the reaction chamber at different and substantially non-overlapping times relative to one another if substantially all of one of the materials is purged from within the reaction chamber prior to the provision of the other material within the reaction chamber. The materials are present in the reaction chamber at different and entirely non-overlapping times relative to one another if an entirety of the first material is purged from within the reaction chamber prior to provision of the second material within the reaction chamber.

Referring to FIG. 1, the alloy process is an ALD-type process comprising a first sequence of four steps 2, 4, 6 and 8; and a second sequence of four steps 10, 12, 14 and 16. In an application for forming a dielectric material comprising a mixture of hafnium oxide and aluminum oxide, the first sequence is an ALD-type process for forming one of hafnium oxide and aluminum oxide, and the second sequence is an ALD-type process for forming the other of hafnium oxide and aluminum oxide. For instance, if the first sequence is utilized to form hafnium oxide, the precursor $M_1$ will be a hafnium-containing precursor such as, for example, TDMAH, TDEAH or TMEAH; and the reactant (R) will be an oxidizer, such as, for example, ozone.

Precursor $M_1$ is introduced into an ALD reaction chamber with a substrate (such as, for example, a semiconductor substrate) to form a hafnium-containing layer over a surface of the substrate (step 2). Excess precursor is then flushed from the chamber with a suitable purge (step 4), and subsequently the oxidizing reactant is introduced into the chamber to convert the hafnium-containing layer to hafnium oxide (step 6). Excess oxidizing reactant is then flushed from the chamber with a suitable purge (step 8), and the process can be repeated "x" times (represented by dashed line 3 in FIG. 1) to form the hafnium oxide to a desired thickness.

After formation of the hafnium oxide to the desired thickness, the second sequence of steps 10, 12, 14 and 16 can proceed. Specifically, an aluminum-containing precursor ($M_2$) is flowed in the reaction chamber and utilized to form an aluminum-containing layer over the hafnium oxide (step 10). Subsequently, excess aluminum-containing precursor is flushed from the chamber with a suitable purge (step 12), and the oxidizing reactant is flowed into the chamber to convert the aluminum-containing layer to aluminum oxide (step 14). The oxidizing reactant can then be flushed from the chamber with a suitable purge (step 16).

The second sequence can be repeated "y" times (represented by dashed line 5 in FIG. 1) to form the aluminum oxide to a desired thickness. Further, the combined first and second sequences can be repeated "z" times (represented by dashed line 7 in FIG. 1) to form the mixed hafnium oxide/aluminum oxide dielectric to a desired thickness.

Although the processing of FIG. 1 was described with $M_1$ corresponding to a hafnium-containing precursor and $M_2$ corresponding to an aluminum-containing precursor, it is to be understood that such can be reversed so that $M_1$ corresponds to an aluminum-containing precursor and $M_2$ corresponds to a hafnium-containing precursor.

An advantage of the alloy-type process of FIG. 1 is that such can enable tight control over the relative quantities of aluminum and hafnium in a dielectric material. However, since the aluminum and hafnium are in discrete layers relative to one another, the aluminum does not influence the crystalline state of the hafnium oxide to the extent that it would if it were in the same layer as the hafnium.

In contrast to the alloy-type process of FIG. 1, the MMO process of FIG. 2 forms a mixed dielectric having aluminum oxide and hafnium oxide in one or more common layers. The MMO process comprises a sequence of steps 20, 22, 24, 26, 28 and 30. Initially, the first metal precursor ($M_1$) is flowed into an ALD reaction chamber with a substrate to form a metal-containing layer across the substrate (step 20). Excess precursor is then flushed from the chamber with a suitable purge (step 22). The second metal precursor ($M_2$) is then flowed into the chamber (step 24). Some metal from the second precursor can integrate into the metal-containing layer formed with the first precursor to convert the layer to a mixed-metal layer. For instance, if the first precursor comprises hafnium and the second precursor comprises aluminum, the layer formed with the first precursor will be a hafnium-containing layer. Such can be converted to a mixed-metal layer containing a mixture of hafnium and aluminum through the flow of the second precursor into the reaction chamber at step 24.

In subsequent processing, excess second precursor is flushed from the chamber with a suitable purge (step 26), and the reactant is flowed into the chamber (step 28) to react with the mixed-metal layer. In particular aspects, the reactant can comprise ozone, and is utilized to convert a layer containing a mixture of aluminum and hafnium to a layer containing a mixture of aluminum oxide and hafnium oxide. Excess reactant is then flushed from the chamber with a suitable purge (step 30).

The MMO sequence can be repeated "x" times (represented by dashed line 21 in FIG. 2) to form the mixed hafnium oxide/aluminum oxide dielectric to a desired thickness.

The aluminum-containing precursor and hafnium-containing precursor can be provided in any order relative to one another in the MMO process. However, it is typically found that the amount of hafnium in the mixed hafnium oxide/aluminum oxide dielectric will be much larger if the hafnium-containing precursor is utilized first in the MMO process (in other words, is utilized at step 20 of the FIG. 2 process), followed by the aluminum-containing precursor.

The MMO process has the advantage of forming a layer containing both hafnium and aluminum (so that the aluminum can strongly influence the crystallographic properties of the hafnium oxide to force the hafnium oxide to be predominantly in the tetragonal phase when the hafnium oxide crystallizes). Thus, the MMO process allows aluminum to be distributed throughout the film differently than the alloy process.

In some aspects, the invention includes new methods combining MMO technologies with alloy-type technologies. In such aspects, the invention can be used to form dielectric materials primarily comprising hafnium oxide, but also comprising small, controlled amounts of aluminum oxide to force the hafnium oxide to crystallize predominantly in the tetragonal crystal phase. The invention can also be extended to form zirconium oxide-containing dielectric materials in a similar manner to the described manner of forming hafnium oxide-containing dielectric materials. Although the invention can have particular advantages for utilization in forming dielectric materials containing hafnium oxide or zirconium oxide, the methodologies described herein can also be utilized for forming other materials, including, various silicides, oxides and nitrides, as will be discussed in more detail below.

An exemplary process of the present invention is described with reference to a flow chart shown in FIG. 3. Such flow chart is described with similar nomenclature to that utilized for describing the flowcharts of FIGS. 1 and 2. Accordingly, the symbols "$M_1$" and "$M_2$" are utilized to refer to first and second precursors, and generally will refer to metal-containing precursors; but it is to be understood that the precursors can, in some aspects, be precursors for non-metallic materials, such as, for example, germanium or silicon. The symbol "R" will refer to a reactant, and typically will correspond to an oxidizing reactant such as, for example, ozone; but can also correspond to siliciding or nitridizing reactants in some aspects of the invention.

Figure 3:
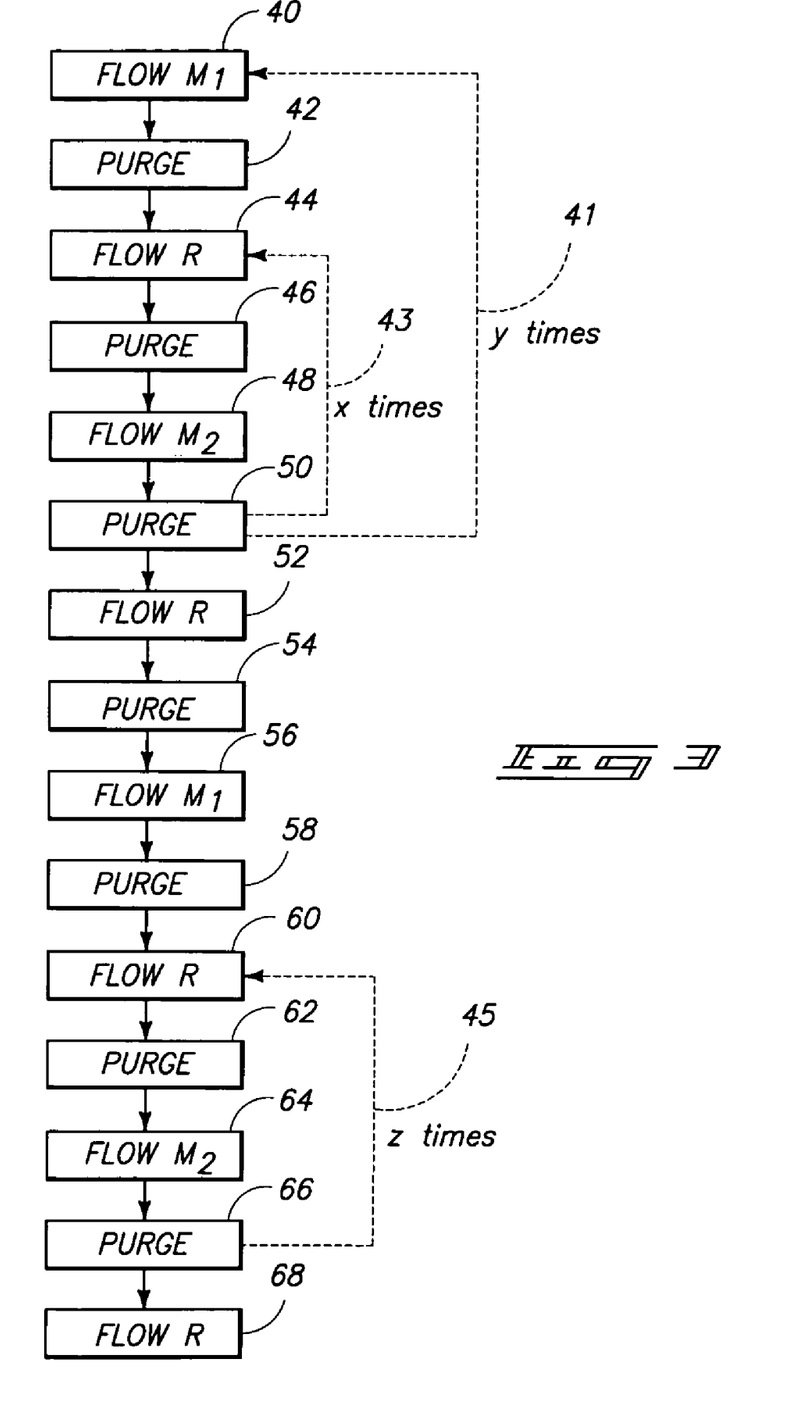
FIG. 3 is a flow-chart diagram describing an exemplary aspect of the present invention which combines an alloy process with an MMO process.

The process of FIG. 3 is an ALD-type process which comprises a first sequence of steps 40, 42, 44, 46, 48 and 50; followed by a second sequence of steps 52, 54, 56, 58, 60, 62, 64, 66 and 68.

The first sequence begins with flow of the precursor $M_1$ into a reaction chamber having a substrate (such as, for example, a semiconductor substrate) therein (step 40). Such can form a substantially saturated monolayer across a surface of the substrate, with such monolayer corresponding to a component derived from precursor $M_1$. For instance, precursor $M_1$ can comprise aluminum, germanium, hafnium, a lanthanide, niobium, silicon, tantalum, titanium, yttrium or zirconium; and the component within the monolayer can include the aluminum, germanium, hafnium, lanthanide, niobium, silicon, tantalum, titanium, yttrium or zirconium.

Excess precursor $M_1$ is then flushed from the reaction chamber with a suitable purge (step 42), and then reactant "R" is flowed into the chamber (step 44). The reactant can comprise any suitable material which reacts with the component derived from precursor $M_1$ to form a desired composition. For instance, in some aspects the reactant can comprise nitrogen, oxygen or silicon to accomplish nitridation, oxidation or silicidation, respectively, of the component derived from precursor $M_1$. In particular aspects, the component derived from precursor $M_1$ will contain either hafnium or aluminum, and the reactant will be an oxidizing reactant, such as, for example, ozone, utilized to form either hafnium oxide or aluminum oxide from the component.

The reactant is then flushed from the reaction chamber with a suitable purge (step 46), and thereafter the precursor $M_2$ is introduced into the reaction chamber (step 48). The precursor $M_2$ is utilized to form a substantially saturated monolayer comprising a component derived from precursor $M_2$. In particular aspects, precursor $M_2$ can comprise aluminum, germanium, hafnium, a lanthanide, niobium, silicon, tantalum, titanium, yttrium or zirconium; and the component derived from precursor $M_2$ can include the aluminum, germanium, hafnium, lanthanide, niobium, silicon, tantalum, titanium, yttrium or zirconium. In some aspects in which the component derived from precursor $M_1$ contains one of hafnium or aluminum, and the reactant is an oxidizing reactant, the component derived from precursor $M_2$ can contain the other of hafnium or aluminum so that the combined flows of $M_1$, $M_2$ and R form a mixed dielectric comprising hafnium oxide and aluminum oxide.

The precursor $M_2$ is then flushed from the reaction chamber with a suitable purge (step 50), and the reaction sequence of FIG. 3 proceeds along one of three alternative routes. One route is to loop back to the flow of precursor $M_1$ (step 40), as designated by dashed line 41. This route corresponds to an MMO process, in that the route has a substantially saturated monolayer formed from precursor $M_2$ at step 48, followed by a purge at step 50, and then flow of the second precursor $M_1$ without any intervening flow of reactant. The route can be designated by the shorthand $M_2$-$M_1$, where $M_2$ and $M_1$ designate the pulses of precursors $M_2$ and $M_1$, respectively, and the hyphen indicates that the second pulse (i.e., the pulse of precursor $M_1$) directly follows the first pulse (i.e., the pulse of precursor $M_2$). The term "directly follows" indicates that either the first listed pulse is immediately follows by the second listed pulse, or that only purging separates the listed pulses (with a purge being exhaustion of the material of the first pulse from a reaction chamber, which may or may not include utilization of a purge gas). Alternatively considered, the term "directly follows" means that no intervening flow of reactant material or precursor occurs between the listed pulses.

If one of the precursors $M_1$ and $M_2$ contains hafnium and the other contains aluminum, and the process of FIG. 3 is utilized to form a dielectric material predominantly comprising hafnium oxide, it can be advantageous for precursor $M_2$ to be the precursor containing hafnium. Specifically, since the MMO process of FIG. 3 provides precursor $M_2$ first and precursor $M_1$ second, there will tend to be more hafnium in the layer formed by such MMO process if precursor $M_2$ contains the hafnium than if precursor $M_1$ contains the hafnium.

The other two routes that can follow purge step 50 are both alloy processes. One of these routes is to loop back to the flow of reactant at step 44 as designated by dashed line 43, and the other is to proceed forward to a flow of reactant at step 52. Either route can be designated by the shorthand $M_2$-R.

If the flow proceeds to step 52, it can be followed by a purge of excess reactant from within the reaction chamber (step 54), followed by flow of the precursor $M_1$ into the chamber to form another substantially saturated monolayer (step 56). Subsequently, excess of the precursor $M_1$ can be purged from the chamber (step 58) and reactant can be flowed into the chamber (step 60). The excess reactant can then be purged from the chamber (step 62), and the precursor $M_2$ flow to the chamber to form another substantially saturated monolayer (step 64), followed by purge of any excess precursor $M_2$ (step 66).

After the precursor $M_2$ is flushed from the reaction chamber with a suitable purge (step 66), the reaction sequence of FIG. 3 proceeds along one of two alternative routes. One route is to loop back to the flow of reactant (step 60), as designated by dashed line 45, and the other is to finish the sequence with one more flow of reactant (step 68), which can then be followed with additional processing (not shown) to form other layers or structures over the layers formed by the processing of FIG. 3.

The pulse sequence of FIG. 3 can be designated by the shorthand $[M_1\text{-}(R\text{-}M_2\text{-})_x]_y R\text{-}M_1\text{-}[R\text{-}M_2\text{-}]_z R$; where a hyphen between pulses means that one pulse follows another either immediately or with only purging separating the pulses. Such sequence includes the subset of pulses corresponding to the sequence $[M_1\text{-}(R\text{-}M_2\text{-})_x]_y R\text{-}M_1\text{-}[R\text{-}M_2\text{-}]_z$.

The subscripts "x", "y" and "z" in the above-described pulse sequences correspond to the number of repeats of the loops designated by dashed lines 41, 43 and 45 of FIG. 3, respectively. Generally, x, y and z will be integers greater than 1. The integers x, y and z can be the same as one another or different. In aspects in which the pulse sequences are utilized to form a mixture of hafnium oxide and aluminum oxide, the precursor $M_1$ can correspond to TMA, $AlCl_3$, $AlR_xCl_{3-x}$ (where R is an alkyl group and x either 1 or 2), etc.; the precursor $M_2$ can correspond to TMEAH, TDMAH, TDEAH, $HfCl_4$, $Hf(NR_2)_xCl_{4-x}$ (where R is an alkyl group and x either 1, 2 or 3), etc.; and the reactant (R) can correspond to $O_3$ or other suitable oxidants. Accordingly, a pulse sequence suitable for forming mixed aluminum oxide and hafnium oxide in accordance with FIG. 3 is $[TMA\text{-}(O_3\text{-}TDMAH\text{-})_x]_y O_3\text{-}TMA\text{-}[O_3\text{-}TDMAH\text{-}]_z O_3$. In such pulse sequence, one or more of the integers x, y and z can be greater than 2, greater than 3, greater than 5, or greater than 10 in some aspects of the invention. In particular aspects of the invention, it can be desired to form a dielectric material containing aluminum oxide and hafnium oxide to a thickness of about 75 angstroms for utilization as a capacitor dielectric. In such particular aspects, the integers x, y and z can be 10, 5 and 3, respectively.

The pulse sequence of FIG. 3 is an exemplary pulse sequence which can be utilized in aspects of the present invention, and it is be understood that variations of such pulse sequence can also be utilized in aspects of the present invention. Other exemplary pulse sequences for formation of mixed dielectrics containing aluminum oxide and hafnium oxide are [TMA-(O$_3$-TDMAH-)$_x$]$_y$TMA-[O$_3$-TDMAH-]$_z$O$_3$, O$_3$-[TMA-(O$_3$-TDMAH-)$_x$]$_y$O$_3$-TMA-[O$_3$-TDMAH-]$_z$O$_3$, and O$_3$-[TMA-(O$_3$-TDMAH-)$_x$]$_y$TMA-[O$_3$-TDMAH-]$_z$O$_3$. Such pulse sequences can also applied to formation of materials other than aluminum oxide and hafnium oxide, and can be generally written as [M$_1$-(R-M$_2$-)$_x$]$_y$M$_1$-[R-M$_2$-]$_z$R, R-[M$_1$-(R-M$_2$-)$_x$]$_y$R-M$_1$-[R-M$_2$-]$_z$R, and R-[M$_1$-(R-M$_2$-)$_x$]$_y$M$_1$-[R-M$_2$-]$_z$R. In all of such aspects, one or more of the integers x, y and z can be greater than 2, greater than 3, greater than 5, or greater than 10; and can be 10, 5 and 3, respectively, in particular applications for forming mixed aluminum oxide/hafnium oxide to a thickness of about 75 Å.

The exemplary pulse sequences discussed above can, in some aspects, be considered to comprise the pulse subsets M$_2$-M$_1$-R and M$_1$-(R-M$_2$-)$_x$, where x is at least 2; with such subsets occurring in the shown order in particular applications. For instance, the aspect described in FIG. 3 has the pulse subset M$_2$-M$_1$-R occurring as steps 48, 50, 40, 42 and 44 are looped together by loop 41; and has the pulse subset M$_1$-(R-M$_2$-)$_x$ occurring as steps 56, 58, 60, 62, 64 and 66 (with steps 60, 62, 64 and 66 being the loop (R-M$_2$-)$_x$).

In particular applications, the exemplary pulse sequences discussed above can be considered to comprise the pulse sequence [M$_1$-(R-M$_2$-)$_x$]$_y$...M$_1$-[R-M$_2$-]$_z$, where the hyphen means that one pulse directly follows another, and where "..." means that a pulse follows another, but not necessarily directly; and in other particular applications, the exemplary pulse sequences discussed above can be considered to comprise the pulse sequence R-[M$_1$-(R-M$_2$-)$_x$]$_y$...M$_1$-[R-M$_2$-]$_z$R.

Alternatively considered, some of the exemplary pulse sequences discussed above can be considered to comprise the pulse subsets R-M$_1$, R-M$_2$ and M$_2$-M$_1$-R. For instance, the aspect described in FIG. 3 has the pulse subset R-M$_1$ occurring at steps 52, 54 and 56; the pulse subset R-M$_2$ occurring at steps 60, 62 and 64; and the pulse subset M$_2$-M$_1$-R occurring as steps 48, 50, 40, 42 and 44 are looped together by loop 41. The pulse subsets R-M$_1$, R-M$_2$ and M$_2$-M$_1$-R can occur in various orders relative to one another depending on which of the exemplary pulse sequences is being utilized.

It is noted that the pulse subsets R-M$_1$ and R-M$_2$ can be considered to be pulse sequences of reactant followed by precursor. The precursor directly follows the reactant into the reaction chamber, but is in the chamber at a different and substantially non-overlapping time than the reactant.

It is further noted that the pulse subset M$_2$-M$_1$-R can be considered to include the steps of: (1) provision of a pulse of the second precursor (M$_2$) within the reaction chamber to form a substantially saturated monolayer comprising a second component from the second precursor; (2) removal of substantially all of the second precursor from within the reaction chamber; (3) provision of a pulse of the first precursor (M$_1$) within the reaction chamber and integration of a first component from the first precursor within the substantially saturated monolayer; (4) removal of substantially all of the first precursor from within the reaction chamber; and (5) exposure of the substantially saturated monolayer to the reactant (R).

In some exemplary applications utilizing the pulse sequence of FIG. 3, or any of the other above-described pulse sequences, M$_1$ and M$_2$ can be considered to be first and second metal-containing precursors containing first and second metals, respectively, where the first metal is different than the second metal. The reactant (R) can react with one or both of the first and second metals, and the process can be considered to form a material comprising the first and second metals over a substrate, with at least a portion of such material being product from reaction of the reactant with one or both of the first and second metals. In the exemplary process of forming a mixed dielectric containing hafnium oxide and aluminum oxide, the first and second metals can correspond to aluminum and hafnium, respectively, and the material formed over the substrate can be considered to be substantially entirely product of reaction of both of the first and second metals with an oxidizing reactant.

The processing of the present invention can form high-quality mixed material dielectrics comprising aluminum oxide/hafnium oxide, or aluminum oxide/zirconium oxide. For instance, methodology the present invention can enable formation of a dielectric material consisting of aluminum oxide and hafnium oxide, with an atomic ratio of hafnium to aluminum being from about 1:1 to about 20:1. Even in the materials having very high ratios of hafnium to aluminum, the hafnium oxide can be predominately in the tetragonal phase after appropriate thermal processing to convert aluminum oxide/hafnium oxide in amorphous form to aluminum oxide/hafnium oxide in crystalline form; with exemplary materials having at least 80 volume percent of the hafnium oxide in the tetragonal phase, or even at least 90 volume percent of the hafnium oxide in the tetragonal phase. In some aspects, the MMO processing creates thin layers of mixed hafnium oxide/aluminum oxide that crystallize into tetragonal form to form crystalline seeds, and the alloy processing creates thick layers of hafnium oxide that adopt the tetragonal crystal structure from the crystalline seeds.

A further exemplary aspect of the present invention is described with reference to FIGS. 4-10, which show an exemplary application for the processing sequence of FIG. 3.

Figures 4, 5:
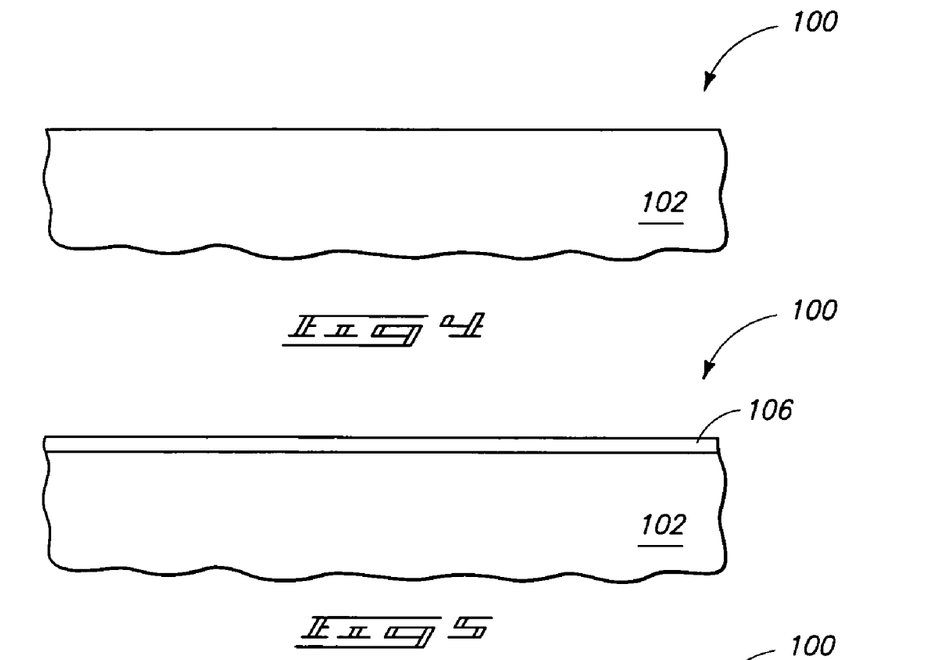
FIG. 4 is a diagrammatic, cross-sectional view of a substrate at a preliminary processing stage of an aspect of the present invention.
FIG. 5 is a view of the FIG. 4 substrate shown at a processing stage subsequent to that of FIG. 4.

Referring initially to FIG. 4, a construction 100 is illustrated at a preliminary processing stage. Construction 100 comprises a substrate 102. The substrate can be an electrically insulative material, electrically conductive material, or semi-conductive material. The substrate is provided within a reaction chamber (not shown in FIG. 4, but such reaction chamber can correspond to, for example, the chamber 200 of FIG. 14).

Referring to FIG. 5, a first layer 106 is over substrate 102 with the processing of steps 40, 42, 44 and 46 of FIG. 3. If M$_1$ is an aluminum-containing precursor, such as TMA, and R is an oxidizing reactant, such as O$_3$, the first layer 106 can consist essentially of, or consist of aluminum oxide.

Figure 6:
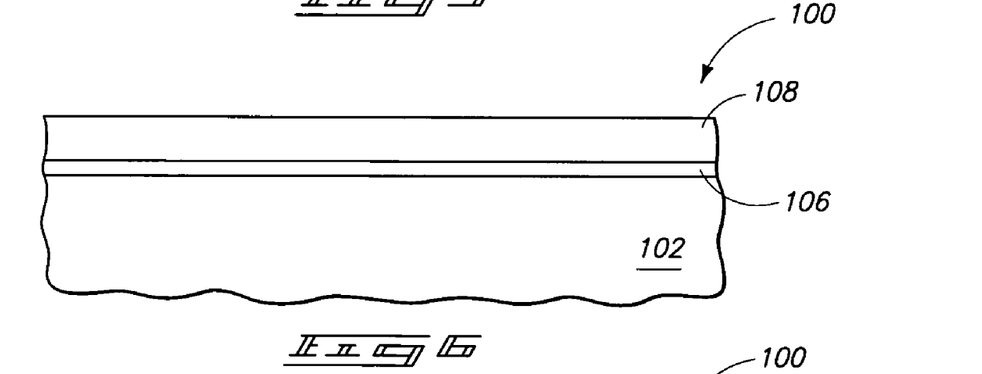
FIG. 6 is a view of the FIG. 4 substrate shown at a processing stage subsequent to that of FIG. 5.

Referring to FIG. 6, a composition 108 is formed over layer 106 utilizing multiple loops of the sequence of steps 48, 50, 44 and 46 of FIG. 3. Composition 108 is thus a stack of several layers of identical composition to one another. If M$_2$ is a hafnium-containing precursor, such as TDMAH, TMEAH or TDEAH; and R is an oxidizing reactant, such as O$_3$, the composition 108 can consist essentially of, or consist of hafnium oxide. In some aspects, the composition 108 can consist essentially of, or consist of one or both of hafnium oxide and zirconium oxide.

Figure 7:
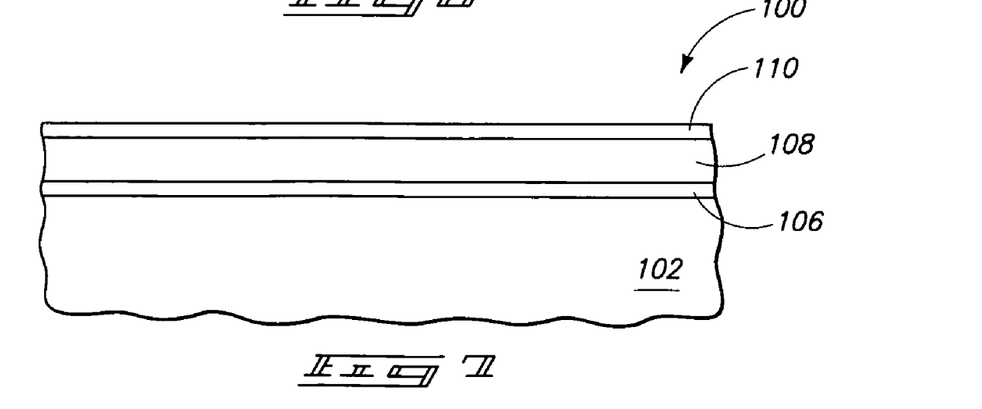
FIG. 7 is a view of the FIG. 4 substrate shown at a processing stage subsequent to that of FIG. 6.

Referring to FIG. 7, a layer 110 is formed over composition 108 utilizing the sequence of steps 48, 50, 40, 42, 44 and 46 of FIG. 3. If M$_1$ is an aluminum-containing precursor, M$_2$ is a hafnium-containing precursor, and R is an oxidizing reactant, the layer 110 can be homogeneous mixture consisting essentially of, or consisting of hafnium oxide and aluminum oxide. In some aspects, the layer 110 can consist essentially of, or consist of aluminum oxide homogeneously mixed with one or both of hafnium oxide and zirconium oxide.

Figure 8:
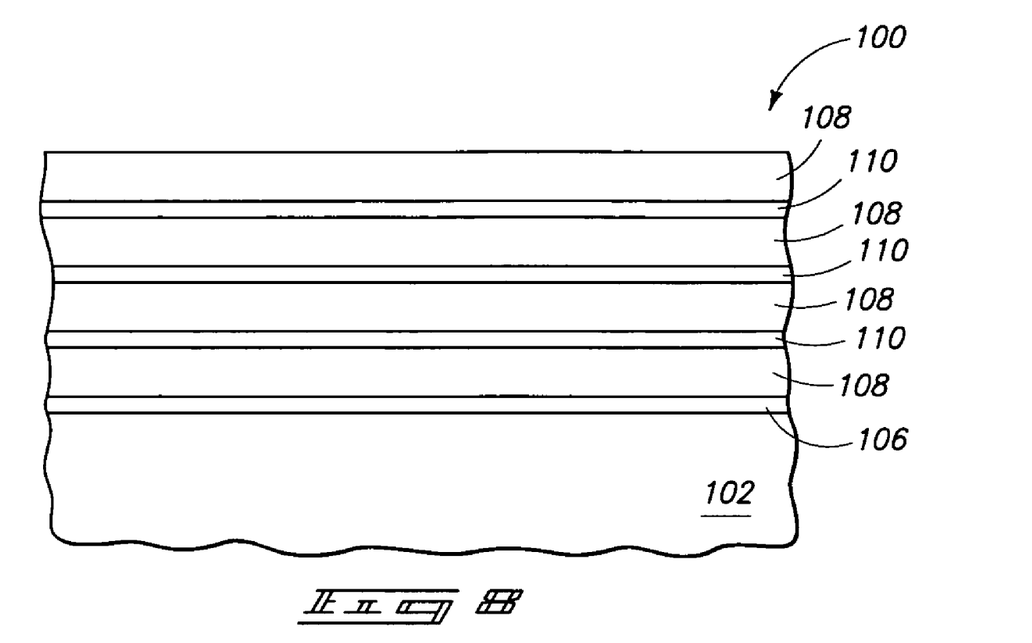
FIG. 8 is a view of the FIG. 4 substrate shown at a processing stage subsequent to that of FIG. 7.

Referring to FIG. 8, the processing sequence of FIG. 3 extends multiple times through the loops designated by dashed lines 41 and 43 to form a stack comprising, in some aspects, hafnium oxide composition 108 alternating with aluminum oxide/hafnium oxide layer 110. The uppermost layer 108 is formed by steps 48, 50, 52 and 54 of FIG. 3, and thus corresponds to a pulse sequence moving beyond the loops designated by dashed lines 41 and 43.

Figure 9:
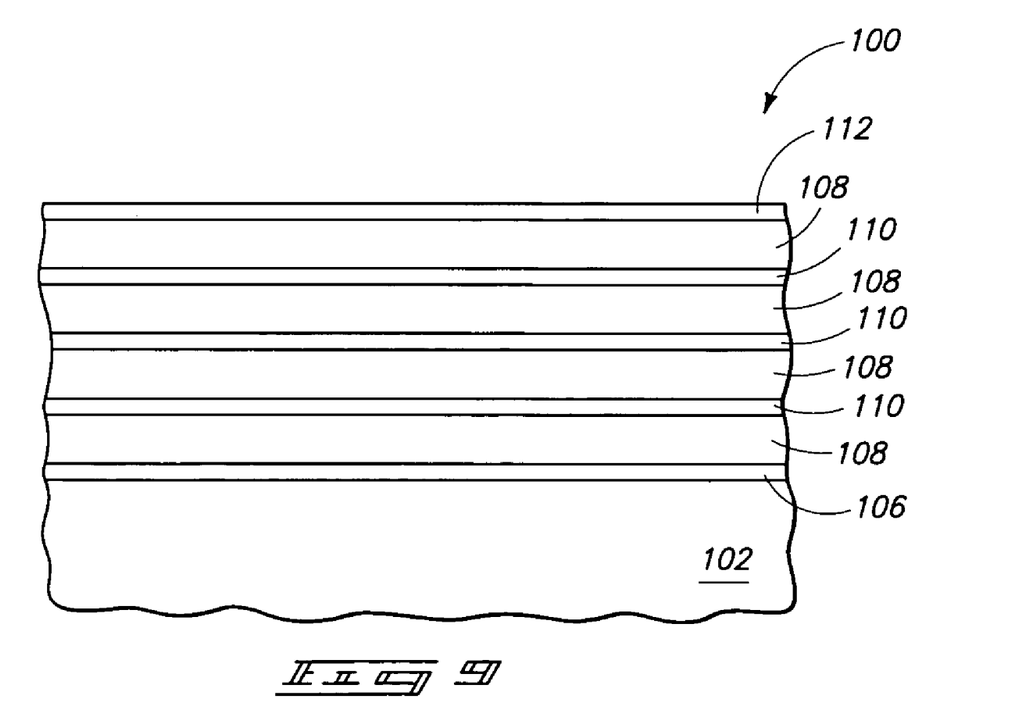
FIG. 9 is a view of the FIG. 4 substrate shown at a processing stage subsequent to that of FIG. 8.

Referring FIG. 9, a layer 112 is formed by the processing sequence of steps 56, 58 and 60 of FIG. 3. If $M_1$ is an aluminum-containing precursor, and R is an oxidizing reactant, the layer 112 can consist essentially of, or consist of aluminum oxide.

Figure 10:
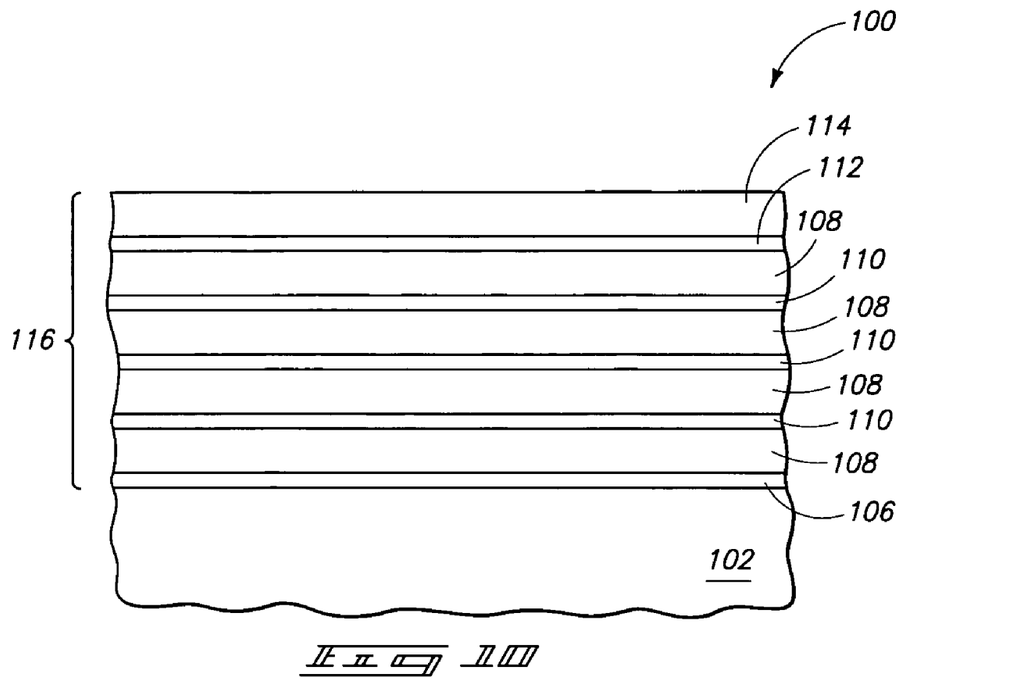
FIG. 10 is a view of the FIG. 4 substrate shown at a processing stage subsequent to that of FIG. 9.

Referring to FIG. 10, a composition 114 is formed by the processing sequence of steps 64, 66, 60 and 62, repeated multiple times around the loop designated by dashed line 45 of FIG. 3, followed by the sequence of steps 64, 66 and 68 to exit the loop. Composition 114 is thus a stack of several layers of identical composition to one another. If $M_2$ is a hafnium-containing precursor, and R is an oxidizing reactant, the composition 114 can consist essentially of, or consist of hafnium oxide. In some aspects, the composition 114 can consist essentially of, or consist of one or both of hafnium oxide and zirconium oxide.

The pulse sequences utilized to form the layers 106, 108, 110, 112 and 114 can all be conducted at one or more pressures of from about 0.1 Torr to about 5 Torr; at one or more temperatures of from about 200° C. to about 350° C.; without plasma; with pulse times of about one second for single wafers and about one minute for batches of multiple wafers; and with one or more flow rates of reactants into the reaction chamber of from about 10 standard cubic centimeters per minute (sccm) to about 2000 sccm.

The layers 106, 108, 110, 112 and 114 of FIG. 10 can together form a dielectric material 116 consisting essentially of, or consisting of aluminum oxide and hafnium oxide. The amount of hafnium oxide within such dielectric material is much higher than the amount of aluminum oxide. Further, the locations of striations containing aluminum oxide within the material 116 can be carefully controlled, and much of the aluminum oxide can be present within layers containing homogeneous mixtures of aluminum oxide with hafnium oxide. Although it can be advantageous for dielectric 116 to comprise aluminum oxide and hafnium oxide, it is also noted that the invention can include aspects in which the material 116 consists essentially of, or consists of aluminum oxide with one or both of zirconium oxide and hafnium oxide.

The layers 106, 108, 110, 112 and 114 will typically be amorphous as deposited, and subsequent thermal treatment will cause crystallization of such layers. If the dielectric 116 consists essentially of, or consists of hafnium oxide and aluminum oxide, the crystallization preferably forms a tetragonal crystalline structures extending through the hafnium oxide and aluminum oxide. Specifically, appropriate thermal treatment of the layers 110 containing aluminum oxide and hafnium oxide will form a tetragonal crystal structures of the hafnium oxide, and such can propagate through the other layers so that material 116 is a crystalline material predominantly in the tetragonal phase. The thermal treatment of the layers 110 can be conventional treatments utilized to form crystalline structures from mixtures of aluminum oxide and hafnium oxide, including, for example, thermal treatment at temperatures of from about 600° C. to about 700° C., or thermal treatment at temperatures above 700° C.

In some aspects, dielectric material 116 can be considered to be a $HfAlO_x$ stack that crystallizes in a predominately textured, tetragonal phase. The combination of alloy and MMO schemes advantageously forms a dielectric material having substantially increased permittivity relative to materials formed with only the MMO scheme, or only with the simple alloy scheme. Further, the combination of the MMO scheme with the alloy scheme can allow tight control over the amount of aluminum incorporated into the stack, and the location of the aluminum within the stack.

Methodology of the present invention can be utilized during fabrication of numerous semiconductor devices, including, for example, capacitor devices. Exemplary processing which can be utilized for forming capacitor devices is described with reference to FIGS. 11-13.

Figure 11:
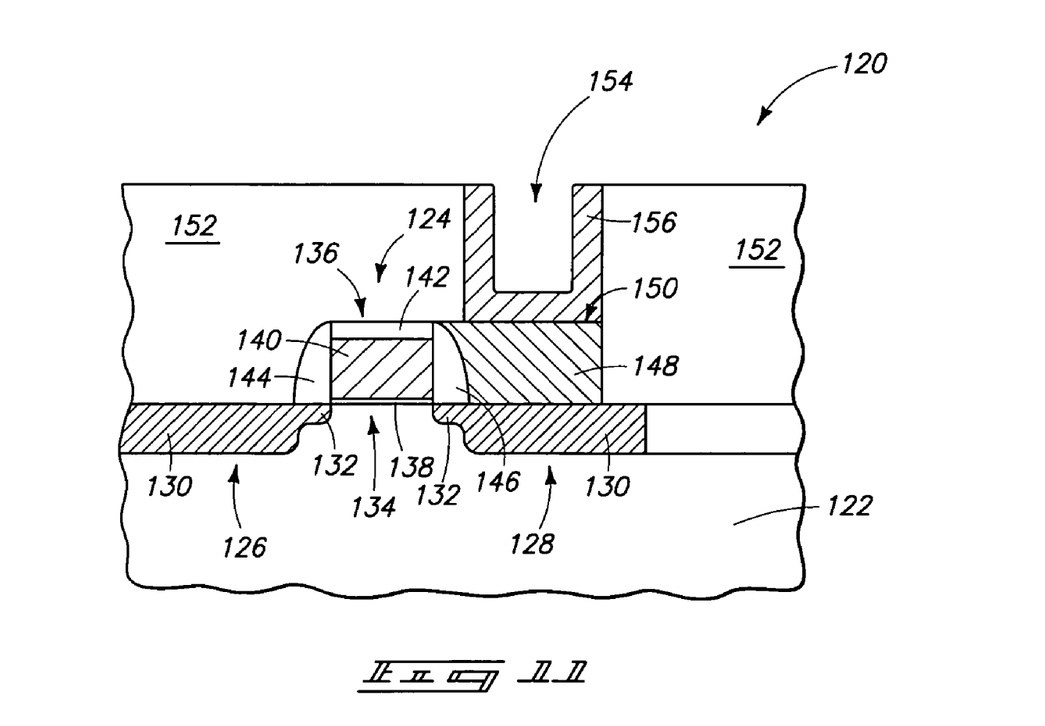
FIG. 11 is a diagrammatic, cross-sectional view of a semiconductor wafer fragment at a preliminary processing stage of an aspect of the present invention.

Referring initially to FIG. 11, a semiconductor wafer fragment 120 is shown at a preliminary processing stage. Fragment 120 comprises a semiconductor substrate 122. Substrate 122 can comprise, for example, monocrystalline silicon lightly doped with background p-type dopant.

A transistor device 124 is shown supported by substrate 122. Device 124 comprises a pair of source/drain regions 126 and 128 extending into substrate 122. The source/drain regions each include a heavily-doped region 130 extending relatively deeply into substrate 122 and a lightly-doped region 132 extending less deeply into substrate 122 than the heavily-doped region. A channel region 134 is between the source/drain regions 126 and 128, and a transistor gate 136 is over the channel region. Transistor gate 136 includes an insulative material 138 (which can be, for example, silicon dioxide, and can be referred to as gate oxide), a conductive material 140 over the insulative material (the conductive material can comprise one or more layers, and in particular aspects will comprise conductively-doped silicon and/or various metals), and an electrically insulative cap 142 over the conductive material (the insulative cap 142 can comprise, for example, silicon nitride and/or silicon dioxide).

A pair of sidewall spacers 144 and 146 extend along sidewalls of gate 136 and over lightly-doped regions 132. Spacers 144 and 146 can comprise any suitable electrically insulative material, including, for example, silicon dioxide and/or silicon nitride. Transistor structure 124 is an exemplary conventional structure, and can be fabricated using conventional methodologies. Other transistor structures can be utilized in place of transistor structure 124.

An electrically conductive pedestal 148 is provided over source/drain region 128. Pedestal 148 can comprise any suitable electrically conductive material, including, for example, conductively-doped silicon and/or various metals. Pedestal 148 has an upper surface 150 which defines an electrical node. It is to be understood that pedestal 148 is optional. If pedestal 148 is eliminated, then the electrical node can be considered to be an upper surface of the diffusion region corresponding to source/drain region 128.

An electrically insulative material 152 is provided over transistor 124, and an opening 154 is formed through insulative material 152 to expose electrical node 150. Insulative material 152 can comprise any suitable material, including, for example, borophosphosilicate glass (BPSG). A conductive material 156 is provided within opening 154. Conductive material 156 can comprise any suitable material, or combination of materials, and in particular aspects can comprise one or more of silicon and various metals. In some aspects, conductive material 156 can comprise, consist essentially of, or consist of titanium nitride. Conductive material 156 has an exposed surface within opening 154. Such exposed surface is shown smooth, but it is to be understood that the surface could also be roughened in accordance with various technologies. For instance, conductive material 156 can include hemispherical grain silicon, and the exposed surface can correspond to a rugged surface of the hemispherical grain silicon.

Figure 12:
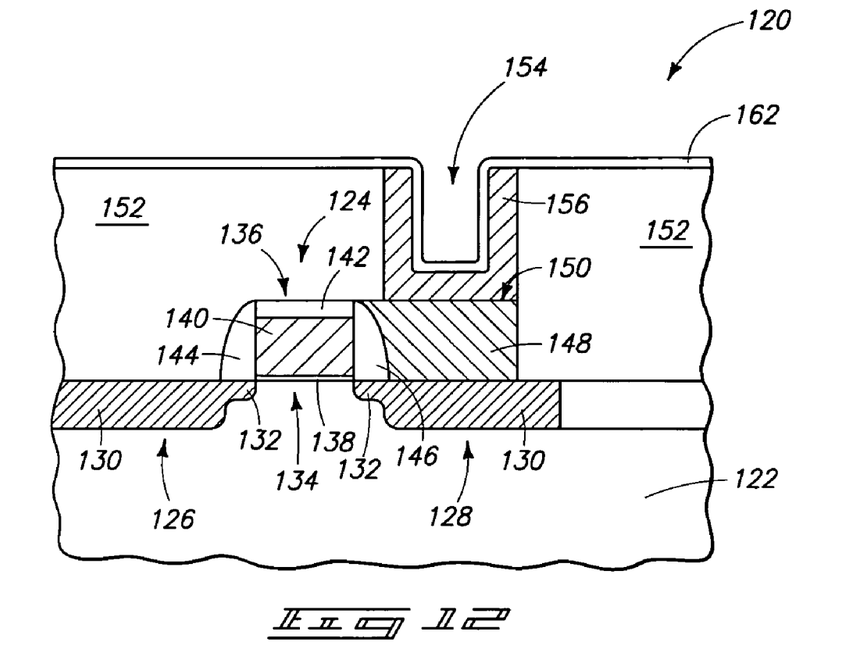
FIG. 12 is a view of the FIG. 11 fragment shown at a processing stage subsequent to that of FIG. 11.

Referring to FIG. 12, a dielectric material 162 is formed within opening 154 and over conductive material 156. In the shown aspect of the invention, dielectric material 162 is formed directly against conductive material 156. Material 162 can be a dielectric comprising a mixture of aluminum oxide and hafnium oxide, and can be formed in accordance with one or more of the exemplary pulse sequences of this invention, such as, for example, the exemplary pulse sequence of FIG. 3. In some aspects, material 162 can be identical to the material 116 discussed above with reference to FIG. 10.

Figure 13:
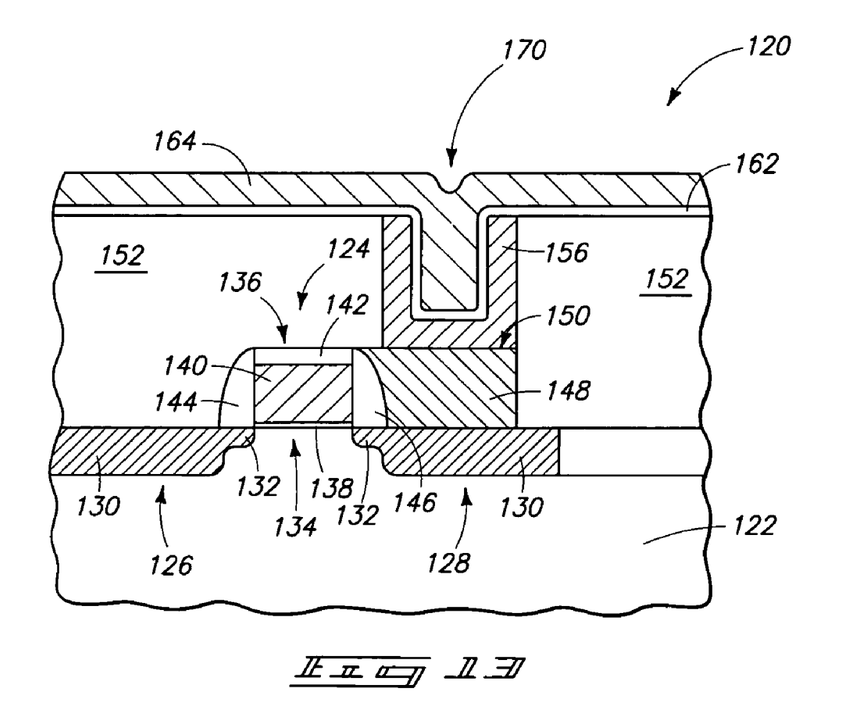
FIG. 13 is a view of the FIG. 11 fragment shown at a processing stage subsequent to that of FIG. 12.

Referring next to FIG. 13, an electrically-conductive material 164 is formed over dielectric composition 162. Material 164 can comprise any suitable electrically conductive species or combination of species, including, for example, metal and/or conductively-doped silicon. In some aspects, material 164 can comprise, consist essentially of, or consist of titanium nitride.

The electrically conductive materials 156 and 164 of recently be thermally treated with temperatures below the temperatures that will cause crystallization within hafnium oxide/aluminum oxide material 162. Thus, in some aspects, the crystallization of material 162 can occur after the thermal treatment of conductive materials 156 and 164. Specifically, the material 162 can, in some aspects, comprise crystalline hafnium oxide and aluminum oxide, with the crystallization of such materials having been done after thermal treatment of the electrically conductive materials 156 and 164.

The layers 156, 162 and 164 together form a capacitor construction 170. Specifically, conductive layer 156 corresponds to a first electrode capacitor construction, conductive layer 164 corresponds to a second electrode of the capacitor construction, and layer 162 corresponds to a dielectric between the first and second capacitor electrodes. The first and second capacitor electrodes are capacitively connected with one another through the dielectric layer. The capacitor construction is electrically connected with source/drain region 128. In other processing (not shown) a bit line can be electrically connected with source/drain region 126 so that the capacitor is incorporated into a dynamic random access memory (DRAM) cell.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a material over a substrate, the method comprising utilization of at least one iteration of an ALD pulse sequence comprising the pulse subsets $M_2$-$M_1$-R- and $M_1$-(R-$M_2$-)$_x$; where x is at least 2; where $M_1$ is a first metal-containing precursor comprising a first metal, $M_2$ is a second metal-containing precursor comprising a second metal different from the first metal, and R is a reactant which reacts with one or both of the first and second metals; where the material formed over the substrate comprises the first and second metals; where at least a portion of the material is product from reaction of the reactant with one or both of the first and second metals; and where the hyphen between pulses means that the second pulse directly follows the first pulse, with the term "directly follows" indicating that the second pulse either immediately follows the first pulse or that only a purge separates the first and second pulses.

2. The method of claim 1 where the pulse sequence comprises the pulse subsets $M_2$-$M_1$-R- and $M_1$-(R-$M_2$-)$_x$ in the shown order.

3. The method of claim 1 where at least one of the first and second metals is selected from the group consisting of aluminum, hafnium, lanthanides, niobium, tantalum, titanium, yttrium and zirconium.

4. The method of claim 1 where both of the first and second metals are selected from the group consisting of aluminum, hafnium, lanthanides, niobium, tantalum, titanium, yttrium and zirconium.

5. The method of claim 1 where one of the first and second metals is hafnium and the other is aluminum, and where an atomic ratio of hafnium to aluminum within the material is from 1:1 to 20:1.

6. The method of claim 5 where substantially all of the hafnium in the material is comprised by hafnium oxide, and where at least 80 volume percent of the hafnium oxide is in tetragonal phase.

7. The method of claim 5 where substantially all of the hafnium in the material is comprised by hafnium oxide, and where at least 90 volume percent of the hafnium oxide is in tetragonal phase.

8. The method of claim 1 where the pulse sequence is $[M_1$-(R-$M_2$-)$_x]_y$ ... $M_1$-[R-$M_2$-]$_z$R; where x and y are integers greater than 1 and can be the same as one another or different from one another; and where z is an integer greater than 1 and can be the same as one or both of x and y or different.

9. The method of claim 8 where R is one or more of $O_3$, $H_2O$, NO and $NH_3$.

10. The method of claim 8 where R is $O_3$; and where one of the first and second metals is aluminum and the other is hafnium.

11. The method of claim 8 where x, y and z are at least 3.

12. A method of forming a material over a substrate, the method comprising utilization of at least one iteration of an ALD pulse sequence comprising the pulse subsets R-$M_1$, R-$M_2$ and $M_2$-$M_1$-R; where $M_1$ is a first metal-containing precursor comprising a first metal, $M_2$ is a second metal-containing precursor comprising a second metal different from the first metal, and R is a reactant which reacts with one or both of the first and second metals; where the material formed over the substrate comprises the first and second metals; and where at least a portion of the material is product from reaction of the reactant with one or both of the first and second metals.

13. The method of claim 12 where the pulse sequence comprises the pulse subsets R-$M_1$, R-$M_2$ and $M_2$-$M_1$-R in the listed order.

14. The method of claim 12 where the pulse sequence comprises the pulse subsets R-$M_1$, R-$M_2$ and $M_2$-$M_1$-R in an order other than the listed order.

15. The method of claim 12 where at least one of the first and second metals is selected from the group consisting of aluminum, hafnium, lanthanides, niobium, tantalum, titanium, yttrium and zirconium.

16. The method of claim 12 where one of the first and second metals is hafnium and the other is aluminum, and where an atomic ratio of hafnium to aluminum within the material is from 1:1 to 20:1.

17. The method of claim 16 where substantially all of the hafnium in the material is comprised by hafnium oxide, and where at least 80 volume percent of the hafnium oxide is in tetragonal phase.

18. The method of claim 16 where substantially all of the hafnium in the material is comprised by hafnium oxide, and where at least 90 volume percent of the hafnium oxide is in tetragonal phase.

19. A method of forming a material over a substrate, comprising:
placing the substrate within a reaction chamber and, while the substrate is within the chamber, performing at least one iteration of the following sequence:
utilizing a pulse sequence of reactant followed by first precursor, where the first precursor directly follows the reactant into the reaction chamber, but is in the chamber at a different and substantially non-overlapping time than the reactant;
utilizing a pulse sequence of the reactant followed by second precursor, where the second precursor directly follows the reactant into the reaction chamber, but is in the chamber at a different and substantially non-overlapping time than the reactant, and where the second precursor is different than the first precursor;
providing another pulse of the second precursor within the reaction chamber and forming a substantially saturated monolayer comprising a second component from the second precursor;
removing substantially all of the second precursor from within the reaction chamber;
providing another pulse of the first precursor within the reaction chamber and integrating a first component from the first precursor within the substantially saturated monolayer;
removing substantially all of the first precursor from within the reaction chamber; and
exposing the substantially saturated monolayer to the reactant.

20. The method of claim 19 where at least one of the first and second components comprises Si or Ge, and wherein the reactant is ozone.

21. The method of claim 19 where the first and second components comprise metals selected from the group consisting of aluminum, hafnium, lanthanides, niobium, tantalum, titanium, yttrium and zirconium.

22. The method of claim 19 where the first and second components comprise aluminum and hafnium, respectively.

23. The method of claim 22 where the reactant is ozone.

* * * * *

UNITED STATES PATENT AND TRADEMARK OFFICE
CERTIFICATE OF CORRECTION

PATENT NO. : 7,537,804 B2  Page 1 of 1
APPLICATION NO. : 11/413466
DATED : May 26, 2009
INVENTOR(S) : Srividya et al.

It is certified that error appears in the above-identified patent and that said Letters Patent is hereby corrected as shown below:

Title Pg, Item (56), under "Other Publications", in column 2, line 2, delete "HfCl4" and insert -- HfCl4 --, therefor.

Title Pg, Item (57), under "Abstract", in column 2, line 3, before "where" delete ":" and insert -- ; --, therefor.

Signed and Sealed this

Twenty-eighth Day of July, 2009

JOHN DOLL
*Acting Director of the United States Patent and Trademark Office*